United States Patent
Kim et al.

(10) Patent No.: US 8,628,870 B2
(45) Date of Patent: Jan. 14, 2014

(54) SECONDARY BATTERY

(75) Inventors: Bongyoung Kim, Suwon-si (KR); Jaeyoung Ha, Suwon-si (KR); Youngho Kim, Suwon-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 759 days.

(21) Appl. No.: 12/643,362

(22) Filed: Dec. 21, 2009

(65) Prior Publication Data

US 2010/0159290 A1    Jun. 24, 2010

(30) Foreign Application Priority Data

Dec. 22, 2008 (KR) .................. 10-2008-0131468

(51) Int. Cl.
  *H01M 14/00* (2006.01)
  *H01M 2/02* (2006.01)
  *H01M 6/08* (2006.01)

(52) U.S. Cl.
  USPC ............... 429/7; 429/164; 429/170; 429/178

(58) Field of Classification Search
  USPC ................. 429/7, 163, 164, 175, 170, 178
  See application file for complete search history.

(56) References Cited

U.S. PATENT DOCUMENTS

| 2005/0208346 A1* | 9/2005 | Moon et al. ...................... 429/7 |
| 2006/0210870 A1 | 9/2006 | Moon et al. |
| 2007/0298287 A1* | 12/2007 | Tajima et al. ..................... 429/7 |
| 2008/0152994 A1 | 6/2008 | Yamagami et al. |

FOREIGN PATENT DOCUMENTS

| EP | 1 482 577 A1 | 12/2004 |
| JP | 2002-231201 | 8/2002 |
| JP | 2008-010501 | 1/2008 |
| KR | 1020060085875 | 7/2006 |
| KR | 1020070109081 | 11/2007 |
| WO | WO 2006/080790 A1 | 8/2006 |
| WO | WO 2008/066222 A1 | 6/2008 |

* cited by examiner

*Primary Examiner* — Patrick Ryan
*Assistant Examiner* — Julian Anthony
(74) *Attorney, Agent, or Firm* — Knobbe, Martens, Olson & Bear, LLP

(57) ABSTRACT

Disclosed is a secondary battery comprising: a bare cell; a protection circuit module having a board having a first hole formed by opening a portion of a first short edge thereof and located on the bare cell; and a first lead plate located between the bare cell and the protection circuit module to support portions of the board located on opposite sides of the first hole about the first hole thereby.

22 Claims, 6 Drawing Sheets

SECONDARY BATTERY

CLAIM FOR PRIORITY

This application is based on and claims priority to Korean Patent Application No. 10-2008-0131468 filed on Dec. 22, 2008 in the Korean Intellectual Property Office (KIPO), the entire contents of which are hereby incorporated by reference.

BACKGROUND OF THE INVENTION

1. Field of the Invention

The present invention relates to a secondary battery.

2. Description of the Related Art

A lithium ion secondary battery includes a core pack having a bare cell and a protection circuit module.

The bare cell includes a positive electrode plate, a negative electrode plate, an electrolyte, and a separator to supply power to an external electronic device. The bare cell is capable of repeated charging and discharging operations during use. The protection circuit module protects the secondary battery from overcharge and overcurrent and prevents lowering of performance due to overdischarge.

The protection circuit module is located on the top of the bare cell and is coupled to the bare cell by a lead plate. It is one of the important issues to increase the coupling strength between devices while increasing the volume energy density of the entire package when the protection circuit module, the bare cell, and the lead plate are coupled to each other.

BRIEF SUMMARY OF THE INVENTION

The object of the present invention provides a secondary battery that can increase a device mounting space on a board of a protection circuit module, can reduce inferior welding generated between the protection circuit module and a bare cell, and can enhance the coupling force between the bare cell and the protection circuit module.

The present invention is not limited to the above-mentioned object, and those skilled in the art can clearly understand other unmentioned objects of the present invention.

In accordance with an embodiment of the present invention, a secondary battery comprising: a bare cell; a protection circuit module having a board having a first hole formed by opening a portion of a first short edge thereof and located on the bare cell; and a first lead plate located between the bare cell and the protection circuit module to support portions of the board located on opposite sides of the first hole about the first hole thereby.

A first terminal having a first sub-terminal and a second sub-terminal corresponding to each other and located such that the first hole are located therebetween may be located on the bottom surface of the first short edge of the board. The first lead plate may include: a first plate located on the top surface of the bare cell and electrically connected to the bare cell; a second plate located under the bottom surface of the first sub-terminal and electrically connected to the first sub-terminal; a third plate located under the bottom surface of the second sub-terminal and electrically connected to the second sub-terminal; and a fourth plate and a fifth plate located at positions of the first plate in correspondence to the first long edge and the second long edge of the bare cell, electrically connected to the second plate and the third plate, and maintaining an interval between the bare cell and the protection circuit module.

One side of the first plate facing the first edge of the bare cell may have a same shape as that of the first short edge of the bare cell and the opposite side of the first plate may be linear. The second to fifth plates may be flat plates. The second plate and the third plate may be connected to the fourth plate and the fifth plate perpendicular to the fourth plate and the fifth plate and the fourth plate and the fifth plate may be connected to the first plate perpendicular to the first plate. The first plate may be resistance-welded or laser-welded to the top surface of the bare cell. The second plate and the third plate may be resistance-welded or laser-welded to the first sub-terminal and the second sub-terminal respectively.

An extension plate may be formed on one side of the first plate facing a second short edge of the bare cell.

Edges of the fourth plate and the fifth plate facing the first short edge of the bare cell may be inclined such that the widths of the fourth plate and the fifth plate become longer as the fourth and the fifth plate go downward.

The fourth plate and the fifth plate may be bent.

Welding holes are formed in the second plate and the third plate and the second plate and the third plate may be soldered to the first sub-terminal and the second sub-terminal respectively.

A second hole formed by opening a portion of the second short edge may be formed in the board.

A first terminal having a first sub-terminal and a second sub-terminal corresponding to each other and located such that the first hole is located therebetween may be located on the bottom surface of the first short edge of the board.

A second lead plate connecting the protection circuit module to the bare cell may be located between a second short edge of the board and the bare cell, and the second lead plate electrically may connect the protection circuit module to the bare cell.

The first lead plate may include: a first plate located on the top surface of the bare cell and electrically connected to the bare cell; a second plate located under the bottom surface of the first sub-terminal and electrically connected to the first sub-terminal; a third plate located under the bottom surface of the second sub-terminal and electrically connected to the second sub-terminal; and a fourth plate and a fifth plate located at positions of the first plate in correspondence to the first long edge and the second long edge of the bare cell, electrically connected to the second plate and the third plate, and maintaining an interval between the bare cell and the protection circuit module.

The secondary battery may further comprise a top case located on the protection circuit module and having a boss press-fitted into the first hole at a lower portion thereof.

The secondary battery according to the present invention can increase the device mounting space on a board of a protection circuit module by making the length of the board longer and can reduce the thickness of the board itself.

Further, when a press jig presses the protection circuit module to weld a lead plate to a bare cell, inferiority due to welding can be prevented by preventing loosening of the lead plate.

Furthermore, the lead plate supports the protection circuit module with a plurality of plates, the coupling force between the bare cell and the protection circuit module can be enhanced, preventing deformation of the protection circuit module due to an external impact.

BRIEF DESCRIPTION OF THE DRAWINGS

The features and advantages of the present invention will be more apparent from the following detailed description in conjunction with the accompanying drawings, in which.

DETAILED DESCRIPTION OF THE INVENTION

Figure 1:
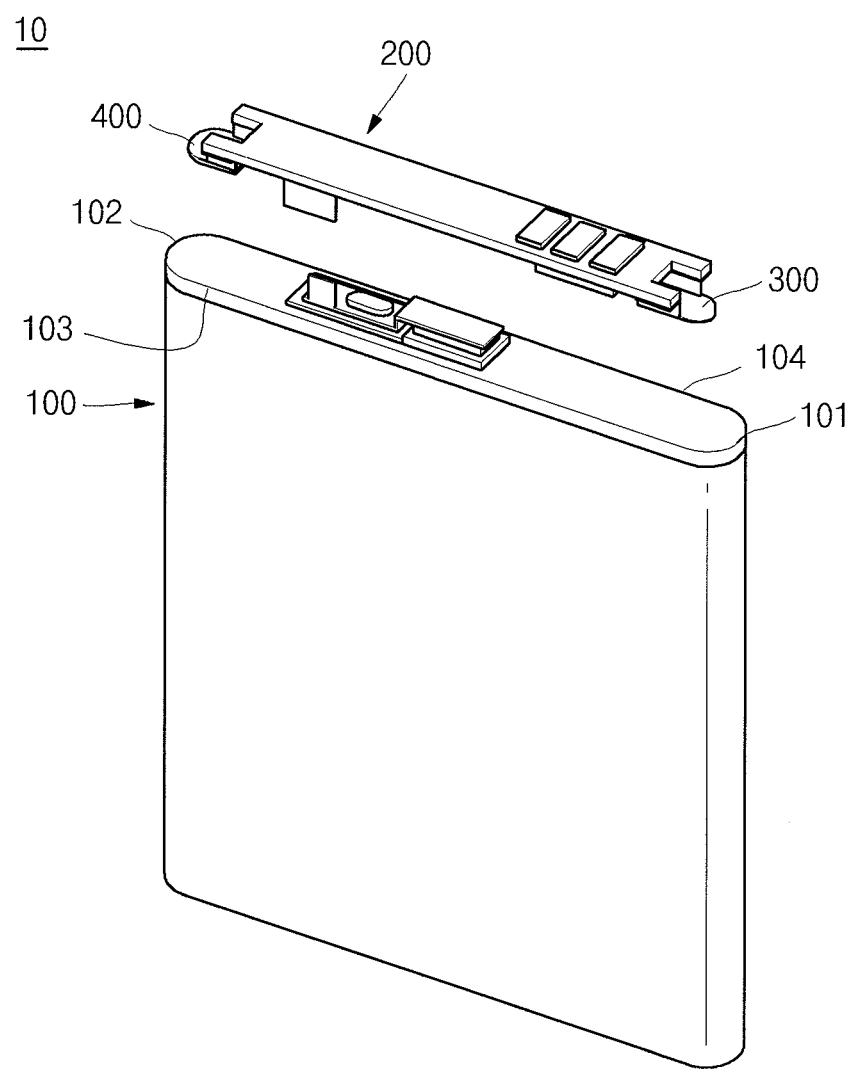
FIG. 1 is a perspective view of a secondary battery according to an embodiment of the present invention.

Details of the following embodiments of the present invention are contained herein and in the accompanying drawings. The advantages and characteristics of the present invention and methods for achieving them will be apparent with reference to the embodiments of the present invention that will be described in detail with reference to the drawings. The same reference numerals are used throughout the specification to refer to the same or like elements.

Hereinafter, secondary batteries according to various embodiments of the present invention will be described in detail with reference to the accompanying drawings.

Figure 2:
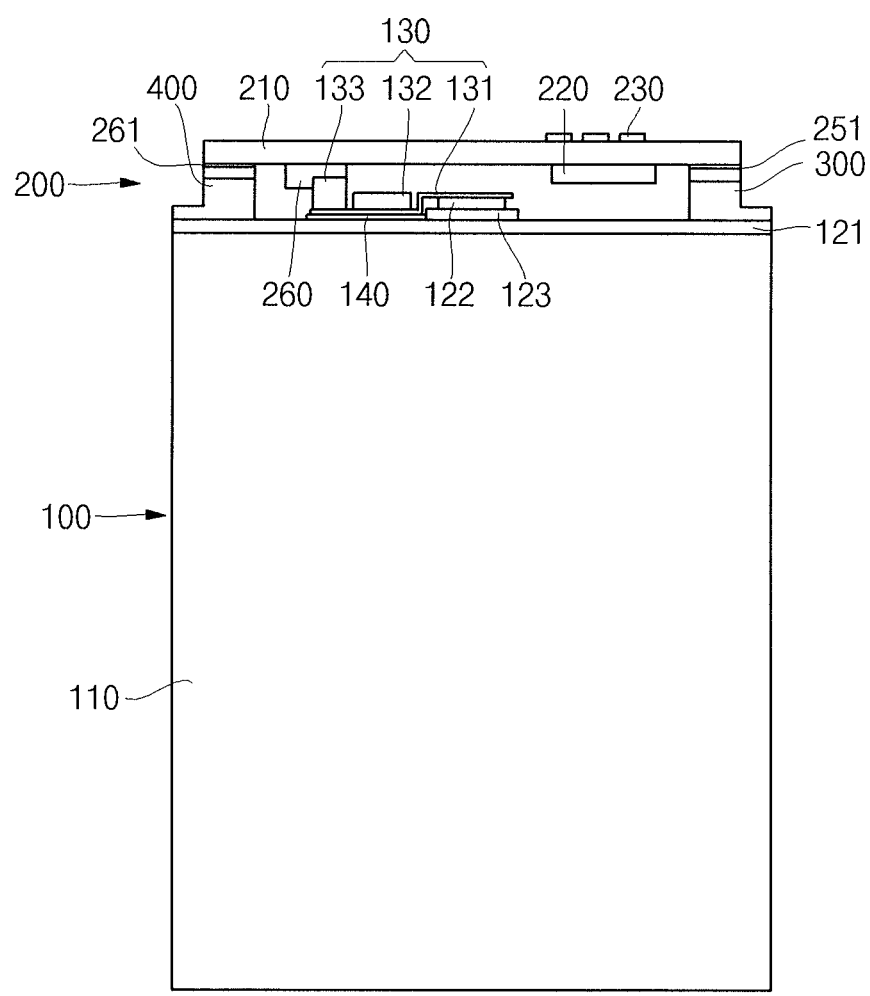
FIG. 2 is a front view of the secondary battery according to the embodiment of the present invention.
Figure 3:
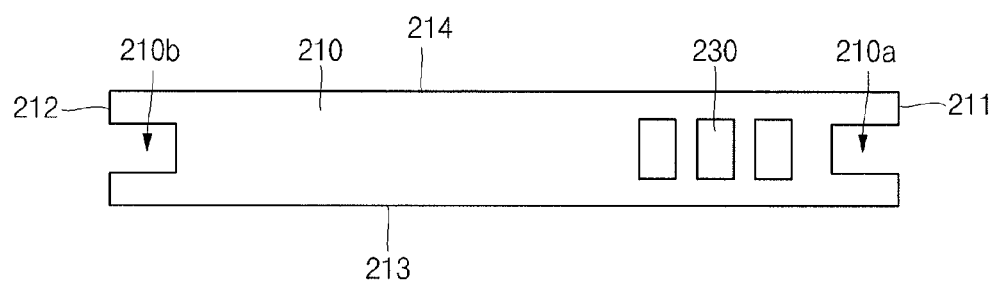
FIG. 3 is a plan view of a protection circuit module according to the embodiment of the present invention.
Figure 4:
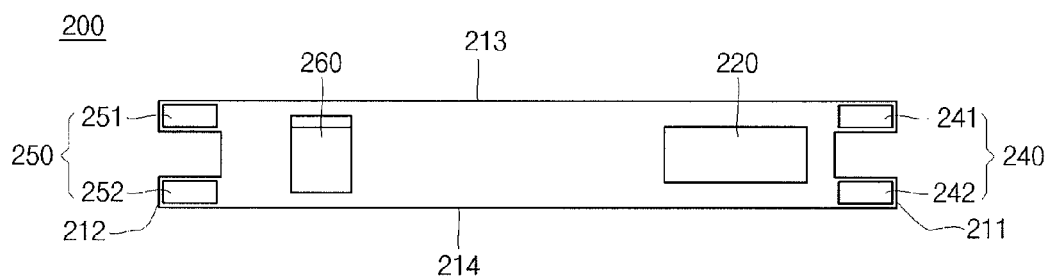
FIG. 4 is a bottom view of the protection circuit module according to the embodiment of the present invention.
Figure 5:
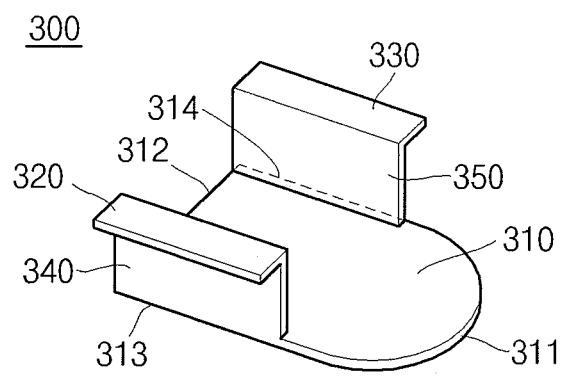
FIG. 5 is a perspective view of a first lead plate according to the embodiment of the present invention.
Figure 6:
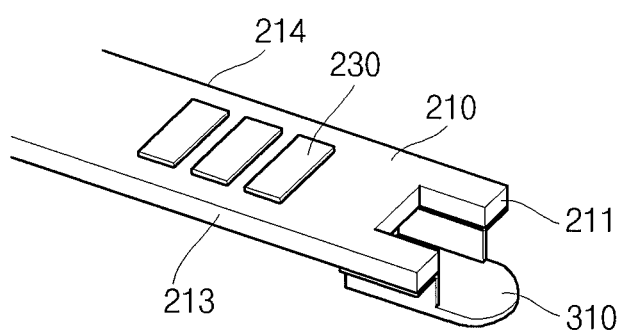
FIG. 6 is a view of the protection circuit module and the first lead plate coupled to each other according to the embodiment of the present invention.

FIGS. 1 and 2 are perspective and front views of a secondary battery 10 according to an embodiment of the present invention. FIGS. 3 and 4 are plan and bottom views of a protection circuit module 200 according to the embodiment of the present invention. FIG. 5 is a perspective view of a first lead plate 300 according to the embodiment of the present invention. FIG. 6 is a view of the protection circuit module 200 and the first lead plate 300 coupled to each other according to the embodiment of the present invention.

Referring to FIGS. 1 to 6, the secondary battery 10 according to the embodiment of the present invention includes a bare cell 100, a protection circuit module 200, a first lead plate 300, and a second lead plate 400.

The bare cell 100 includes a can 110, an electrode assembly (not shown), a cap assembly 120, and a positive temperature coefficient (PTC) unit 130. The electrode assembly is received through an opening formed on one side of the can 110 and the opening is sealed by the cap assembly. The bare cell has a positive electrode and a negative electrode and is the minimum unit of the secondary battery 10 capable of performing charging and discharging operations.

The can 110 has a substantially parallelepiped shape. The top of the can 110 is opened and the sides thereof have curvatures. The can 110 is made of a light metal such as aluminum (Al) and functions as a terminal by itself. The electrode assembly is received through the opened top of the can 110.

The electrode assembly includes a positive electrode plate, a negative electrode plate, and a separator. In the electrode assembly, the separator is interposed between the positive electrode plate and the negative electrode plate. The positive electrode plate, the negative electrode plate, and the separator are wound to form a jelly-roll configuration thereby. The electrode assembly is inserted into the can 110 through the top of the can 110.

The cap assembly 120 includes a cap plate 121, an electrode terminal 122, a gasket 123, an insulation plate (not shown), and a terminal plate (not shown). The cap assembly 120 is coupled to the electrode assembly at the opening of the can 110 together with a separate insulation case to seal the can 110 thereby. The electrode terminal 122 may be a negative electrode terminal.

The PTC unit 130 is located on the top of the cap assembly 120. In more detail, the PTC unit 130 is located on the cap plate 121 and is electrically connected to the electrode terminal 122, and includes a first tab 131 having a bent shape, a PTC device located on the first tab 131 and electrically connected to the first tab 131, and a second tab 133 located on the first tab 131 and electrically connected to a third terminal 260 located on the bottom surface of the protection circuit module 200. The first tab 131 is electrically connected to the electrode terminal 122 by resistance welding or laser welding. The PTC device 132 is a device whose resistance increases as its temperature increases, and interrupts a charge/discharge current when the temperature of the secondary battery 10 is abnormally high. An insulation tape 140 for insulating the first tab 131 and the cap plate 121 from each other is located between the first tab 131 and the cap plate 121.

The protection circuit module 200 includes a board 210, a protection circuit 220, charge/discharge terminals 230, a first terminal 240, a second terminal 250, and a third terminal 260.

The board 210 is spaced apart from the bare cell 100 above the bare cell 100 and is a substantially rectangular flat plate. In more detail, a first rectangular hole 210a and a second rectangular hole 210b, sides of which are opened respectively, are formed at a first short edge 211 and a second short edge 212 of the board 210 respectively. A conductive metal pattern (not shown) is formed in the interior of the board 210 and is electrically connected to the protection circuit 220, the charge/discharge terminals 230, the first terminal 240, the second terminal 250, and the third terminal 260. The board 210 may be a printed circuit board (PCB) 210.

The protection circuit 220 is located under the bottom surface of the board 210 and protects the battery by checking the charge/discharge state of the battery and information about the current, voltage, and temperature of the battery.

The charge/discharge terminals 230 are located on the board 210 to function as electrical passages connected to an external electronic device thereby.

The first terminal 240 is located under the board 210 at the first short edge of the board 210. The first terminal 240 includes a first rectangular sub-terminal 241 and a second rectangular sub-terminal 242 corresponding to each other with the first hole 210a being located therebetween. The first terminal 240 is electrically connected to a second plate 320 and a third plate 330 of the first lead plate 300. The first terminal 240 is made of a metal, and is preferably made of copper.

The second terminal 250 is located under the board 210 at the second short edge of the board 210. The second terminal 250 includes a first rectangular sub-terminal 251 and a second rectangular sub-terminal 252 corresponding to each other with the second hole 210b being located therebetween. The second terminal 250 is electrically connected to a second plate 320 and a third plate 330 of the second lead plate 400. The first terminal 250 is made of a metal, and is preferably made of copper. Then, when the second lead plate 400 is a dummy lead plate for balancing the first lead plate 300, the second terminal is not connected to a conductive metal pattern inside the board 210.

The third terminal 260 is located under the bottom surface of the board 210 and is electrically connected to the second tab 133 of the PTC unit 130 by welding.

The first lead plate 300 and the second lead plate 400 are located between the protection circuit module 200 and the bare cell 100 and are electrically connected to the first short edge 211 and the second short edge 212 of the board 210 respectively. In more detail, the first lead plate 300 and the second lead plate 400 are located at the first short edge 211 and the second short edge 212 of the board 210 to be electrically connected to the first terminal 240 and the second terminal 250 of the protection circuit module 200 thereby. Then, the second dummy plate 400 may be a dummy plate for balancing the first lead plate 300, in which case the second lead plate 400 is merely a mechanical connection unit for coupling the protection circuit module 200 and the bare cell 100 and the second terminal 250 is not electrically connected to the conductive metal pattern inside the board 210. The structure of the first lead plate 300 and the coupling structure of the first lead plate 300 and the protection circuit module 200 are the same as the structure of the second lead plate 400 and the coupling structure of the second lead plate 400 and the protection circuit module 200. Accordingly, the structure of the first lead plate 300 and the coupling structure of the first lead plate 300 and the protection circuit module 200 will be described hereinafter.

The first lead plate 300 includes a first lead plate 310 located on the top surface of the bare cell 100 and electrically connected to the bare cell 100, a second plate 320 located under the bottom surface of the first sub-terminal 241 and electrically connected to the first sub-terminal 241, a third plate 330 located under the bottom surface of the second sub-terminal 242 and electrically connected to the second sub-terminal 242, and a fourth plate 340 and a fifth plate 350 located on the first plate 310 in correspondence to the first long edge 103 and the second long edge 104 of the bare cell 100 respectively, electrically connected to the second plate 320 and the third plate 330 respectively, and maintaining an interval between the bare cell 100 and the protection circuit module 200.

One side 311 of the first plate 310 facing the first short edge 101 of the bare cell 100 has the same shape as the first short edge 101 of the bare cell 100. In more detail, the side 311 of the first plate 310 facing the first short edge 101 of the bare cell 100 has the same curvature as that of the first short edge 101 of the bare cell 100, and the remaining sides 312, 313, and 313 of the first plate 310 are linear. The side 311 of the first plate 310 facing the first short edge 101 of the bare cell 100 protrudes further than sides of the fourth plate 340 and the fifth plate 350 facing the first short edge 311 of the bare cell 100. The first plate 310 is electrically connected to the top surface of the bare cell 100, i.e. the top surface of the cap plate 121 by welding. The welding may be resistance welding or laser welding.

The second plate 320 and the third plate 330 have the same shapes as those of the first sub-terminal 241 and the second sub-terminal 242, and have flat rectangular shapes in more detail. The second plate 320 and the third plate 330 are disposed parallel to the first plate 310 and are electrically connected to the first sub-terminal 241 and the second sub-terminal 242 respectively by welding. The welding may be resistance welding or laser welding.

The fourth plate 340 and the fifth plate 350 have flat rectangular shapes and connect the second plate 320 and the third plate 330 to the first plate 310 respectively. The fourth plate 340 and the fifth plate are perpendicular to the first plate 310 and also are perpendicular to the second plate 320 and the third plate 330.

A conventional lead plate is welded and electrically connected to a board on the inner side of a position where the first lead plate 300 according to the embodiment of the present invention is welded to the board 210. In addition, a board of a protection circuit module is not formed at an upper portion of a conventional secondary battery where a lead plate is welded to a cap plate so as to easily weld the lead plate and the cap plate. This is because a lead plate and a cap plate are connected to each other by resistance welding or laser welding and an upper portion of a welded region needs to be opened to perform laser welding or resistance welding, in particular, spot welding. In other words, a board of a protection circuit module is not formed on the outer side of a position where a lead plate and the board are welded to each other so as to perform resistance welding or laser welding between the lead plate and the cap plate.

However, in the secondary battery 10 according to the embodiment of the present invention, the first terminal 240 is formed at a region where the board 210 conventionally is not formed so as to weld a lead plate and a cap plate 121. The first terminal 240 has a first hole 210a one side of which is opened at the center of the first short edge 211 of the substrate 210, and the first sub-terminal 241 and the second sub-terminal are formed around the first hole 210a. The first lead plate 300 is electrically connected to the protection circuit module 200 through the first sub-terminal 241 and the second sub-terminal 242 and welding for electrically connecting the first lead plate 300 and the cap plate 121 to each other are possible through the first hole 210a.

Hence, the board 210 is made longer to the outside due to existence of the first sub-terminal 241 and the second sub-terminal 242, in which case the welding region of the lead plate 300 and the protection circuit module 200 is expanded to the outside by locating the first terminal at the welding region of the lead plate 300 and the protection circuit module 200. In other words, since the protection circuit module 210 is made longer by the length of the first terminal 240 and the welding region of the first lead plate 300 and the protection circuit module 200 is moved toward the first terminal, the mounting space for other elements formed on the top and bottom surfaces of the board 210 can be increased. In addition, since as compared with a manufacturing process in which the board 210 is made thicker to secure a space for forming a conductive metal pattern, a space for forming a conductive metal pattern can be secured by making the board 210 longer, the board 210 can become thinner.

The fourth plate 340 and the fifth plate 350 of the first lead plate 300 can support the protection circuit module 200 along the length of the protection circuit module 200 at the first long edge 213 and the second long edge 214 of the board 210. Hence, considering that a conventional lead plate supports a protection circuit module along the width of the protection module with one plate, the first lead plate 300 can support the protection circuit module 200 on the bare cell 100 more firmly. Therefore, when an external impact or pressure is applied to the secondary battery 10, deformation of the first lead plate 300, thus, deviation of the protection circuit module 200 from the first lead plate 300 due to deformation of the first lead plate 300 is inhibited.

When the first lead plate 300 is welded to the cap plate 121, a press jig presses the top surface of the protection circuit module 200 to attach the first plate 310 to the cap plate 121 without any opening. Then, a conventional lead plate supports a protection circuit module along the width of the protection circuit module with one plate, and since the plate is occasionally deformed by the pressing force of the press jig and the welding region of the lead plate to the cap plate gets loose, a defect can be generated during the welding operation. In more detail, when connecting the welding region of the lead plate to the cap plate, it is difficult to align a welding terminal or laser for welding. Hence, since the welding terminal or laser does not directly make contact with the lead plate but directly makes contact with the cap plate, the cap plate may be punched. Furthermore, since the lead plate does not make contact with the cap plate, the lead plate may not be welded to the cap plate.

Accordingly, in the first lead plate 300 according to the embodiment of the present invention, the fourth plate 340 and the fifth plate 350 support the protection circuit module 200 along the length of the protection circuit module 200 at the first long edge 213 and the second long edge 214 of the board 210. Therefore, since pressure is more easily dispersed even when a pressing jig applies a pressing force to the protection circuit module 200, the fourth plate 340 and the fifth plate 350 are not easily deformed and loosening of the first plate 310 can be more effectively prevented. Furthermore, since one side 311 of the first plate 310 facing the short edge 101 of the bare cell 100 has the same shape as that of the first short edge 101 of the bare cell 100, the first plate 310 is extended to an end of the first short edge 101 of the bare cell 100 to widen the contact area between the first plate 310 and the cap plate 121, more effectively preventing loosening of the first plate 310 by the pressing force of the press jig. The above-mentioned structure of the first lead plate 300 more effectively disperses the pressure of the press jig, reducing defects in welding by reducing deformation of the fourth plate 340 and the fifth plate 350 and reducing loosening of the first plate 310.

A top case (not shown) may be located on the protection circuit module 200 to surround upper portions of the protection circuit module 200 and the bare cell 100 thereby. Bosses (not shown) press-fitted into the first hole 210*a* and the second hole 210*b* are formed at positions of the top case corresponding to the first hole 210*a* and the second hole 210*b* and are coupled to the first hole 210*a* and the second hole 210*b* to firmly couple the protection circuit module 200 to the top case.

Figure 7:
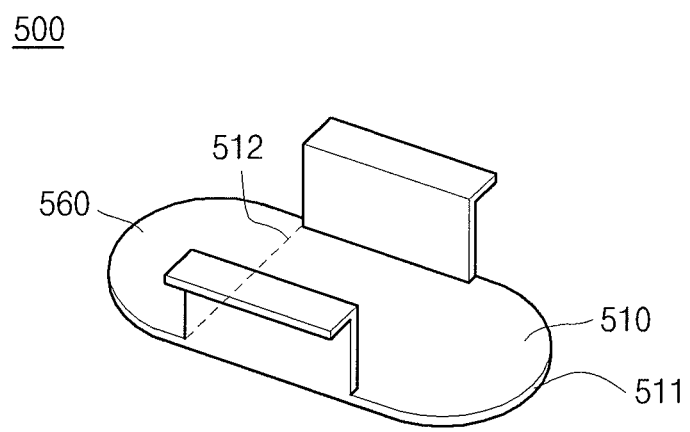
FIG. 7 is a perspective view of a first lead plate according to another embodiment of the present invention.
Figure 8:
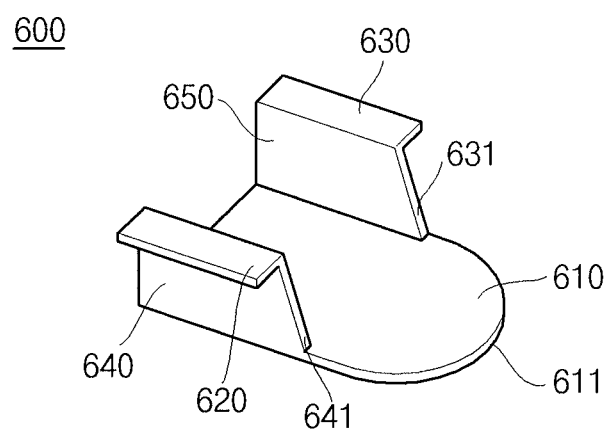
FIGS. 8 to 10 are perspective views of first lead plates according to other embodiments of the present invention.
Figure 9:
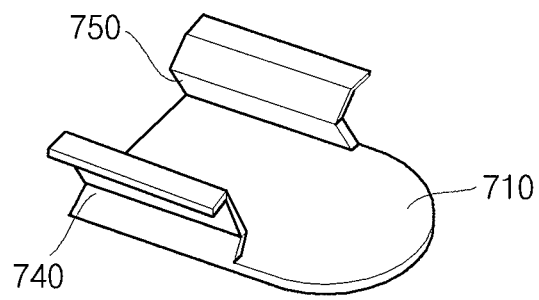
Figure 10:
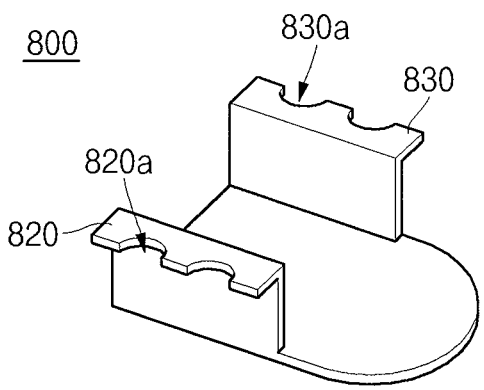

FIG. 7 is a perspective view of a first lead plate 500 according to another embodiment of the present invention. FIGS. 8 to 10 are perspective views of first lead plates 600, 700, and 800 according to other embodiments of the present invention.

The first lead plates according to the following embodiments of the present invention are partially different from the first lead plate according to the first mentioned embodiment of the present invention. Therefore, the differences of the first lead plates according to the following embodiments of the present invention from the first lead plate according to the first mentioned embodiment of the present invention and their functions will be mainly described hereinafter. Although the first lead plates will be mainly described for convenience' sake, second lead plates also have the same structures and functions as those of the first lead plates.

Referring to FIG. 7, in the first lead plate 500 according to the embodiment of the present invention, an extension plate 560 may be further formed on one side 512 of the first plate 510 facing the second short edge of the bare cell. The extension plate 560 may be a flat plate having a curvature so as to have a shape corresponding to one side 511 of the first plate 510 facing the first short edge of the bare cell, but may be a rectangular flat plate.

The extension plate 560 further extends to the inner side of the cap plate from the first plate 510. This is because the contact area of the first lead plate 500 and the bare cell is widened to more effectively prevent loosening of the first lead plate 510 due to the pressing force of a press jig and reduce a welding inferiority between the first plate 510 and the cap plate thereby.

Hereinafter, a first lead plate according to another embodiment of the present invention will be described.

Referring to FIG. 8, the fourth plate 640 and the fifth plate 650 of the first lead plate 600 according to the embodiment of the present invention have edges 631 and 641 facing the first short edge of the bare cell and inclined such that their widths become longer as they go downward. In other words, while the lengths of the edges of the fourth plate 640 and the fifth plate 650 connected to the second plate 620 and the third plate 630 are the same as those of the first mentioned embodiment of the present invention, the lengths of the edges of the fourth plate 640 and the fifth plate 650 connected to the first plate 610 are longer toward the first short edge of the bare cell.

The fourth plate 640 and the fifth plate 650 have a longer contact length with the first plate 610 to support the protection circuit module on the bare cell more firmly. Furthermore, since as the lengths of the fourth plate 640 and the fifth plate 650 making contact with the cap plate become longer when a press jig presses the top surface of the protection circuit module, pressure is dispersed further and deformation of the fourth plate and the fifth plate 650 is better prevented. Furthermore, since the bottom edges of the fourth plate 640 and the fifth plate 650 extend toward the first plate 610, loosening of the first plate 610 is better prevented when the press jig presses the protection circuit module, thereby reducing the welding inferiority between the first plate 610 and the cap plate.

Hereinafter, a first lead plate according to another embodiment of the present invention will be described.

Referring to FIG. 9, the first lead plate 700 according to the embodiment of the present invention has a bent fourth plate 740 and a bent fifth plate 750. The bending lines of the fourth plate 740 and the fifth plate 750 are parallel to the long edges of the bare cell or the protection circuit module.

When the bare cell is microscopically observed, the top surface of the bare cell, i.e. the top surface of the cap plate may not be the same when its height is measured from the bottom surface of the can due to irregularity of the height of the opened top surface of the can, irregularity of the height of the cap plate, and a coupling error between the can and the cap plate. In other words, the height of the top surface of the bare cell may not be always ideally uniform.

Therefore, when an upper portion of the protection circuit module is pressed by a press jig to weld the first lead plate 700 to the cap plate thereby, the fourth plate 740 and the fifth plate 750 have bending structures to be deformed until the bottom surface of the first plate 710 is attached to the top surface of the cap plate maximally by the pressing force of the press jig. Accordingly, when the height of the top surface of the bare cell is not constant, the irregular height of the bare cell can be compensated for by maximally attaching the first plate 710 to the top surface of the cap plate. In addition, the first lead plate 700 and the cap plate can be firmly coupled to each other by welding the first plate 710 to the cap plate with the first plate 710 being maximally attached to the cap plate.

Hereinafter, a first lead plate according to another embodiment of the present invention will be described.

Referring to FIG. 10, welding holes 820*a* and 820*b* are formed in the second plate 820 and the third plate 830 of the first lead plate 800 according to the embodiment of the present invention. In the embodiment of the present invention, two welding holes 820*a* and 820*b* preferably are formed in each of the second plate 820 and the third plate 830 of the first lead plate 800. In the embodiment of the present invention, although the welding holes 820 have semicircular shapes, sides of which are opened, they may have polygonal shapes and may be complete holes whose sides are not opened.

Although the second plate 820 and the third plate 830 may be electrically connected to the first sub-terminal and the second sub-terminal of the first terminal respectively by resistance welding or laser welding, they can be electrically connected to the first sub-terminal and the second sub-terminal of the first terminal by soldering.

When the second plate 820 and the third plate 830 are welded to the first sub-terminal and the second sub-terminal of the first terminal by soldering, the coupling force increases as the soldered area increases. For example, when the second plate 820 and the first sub-terminal are soldered to each other, soldering needs to be carried out at the outskirt where the second plate 820 meets the first sub-terminal in the case of the welding holes not being formed in the second plate. However, the second plate 820 is firmly welded to the first sub-terminal by widening the soldered area of the first sub-terminal through the cross-sections of the semicircular welding holes formed in the second plate 820.

The secondary batteries according to the embodiments of the present invention can increase the device mounting space on a board and reduce the thickness of the board itself by making the length of the board of the protection circuit module long. Furthermore, when a press jig presses a protection circuit module to weld a lead plate to the bare cell, a welding defect can be more easily prevented by reducing loosening of the lead plate. In addition, since a plurality of plates of the lead plate support the protection circuit module, the coupling force between the bare cell and the protection circuit module can be improved, which more readily prevents deformation of the protection circuit module due to an external impact.

Although the embodiments of the present invention have been described in detail hereinabove, it should be understood that many variations and modifications of the basic inventive concept herein described will still fall within the spirit and scope of the present invention as defined in the appended claims.

What is claimed is:

1. A secondary battery comprising:
   a bare cell;
   a protection circuit module having a board having a first and second short edges and first and second long edges wherein a first hole is formed by an opening in a portion of the first short edge so as to define opposite sides of the first hole on the board wherein the protection circuit module is located on the bare cell and wherein first and second terminals are formed on opposite sides of the first hole; and
   a first lead plate located between the bare cell and the protection circuit module to support portions of the board located on opposite sides of the first hole,
   wherein the first lead plate includes portions that connect to the first and second terminals of the board located on opposite sides of the first hole.

2. The secondary battery of claim 1, wherein the first lead plate is electrically connected to the first short edge of the board.

3. The secondary battery of claim 1, wherein the first short edge of the board defines a bottom surface and wherein a first terminal having a first sub-terminal having a bottom surface and a second sub-terminal having a bottom surface corresponding to each other is located on the bottom surface of the first short edge of the board so that the first hole is located between the first and second sub-terminals.

4. The secondary battery of claim 3, wherein the first lead plate includes:
   a first plate located on the top surface of the bare cell and electrically connected to the bare cell;
   a second plate located under the bottom surface of the first sub-terminal and electrically connected to the first sub-terminal;
   a third plate located under the bottom surface of the second sub-terminal and electrically connected to the second sub-terminal; and
   a fourth plate and a fifth plate located at positions of the first plate in correspondence to a first long edge and a second long edge of the bare cell, electrically connected to the second plate and the third plate, and maintaining an interval between the bare cell and the protection circuit module.

5. The secondary battery of claim 4, wherein a shape of one side of the first plate facing the first edge of the bare cell is corresponding to that of the first short edge of the bare cell and the opposite side of the first plate is linear.

6. The secondary battery of claim 4, wherein the second to fifth plates are flat plates.

7. The secondary battery of claim 4, wherein the second plate and the third plate are connected to the fourth plate and the fifth plate perpendicular to the fourth plate and the fifth plate respectively and the fourth plate and the fifth plate are connected to the first plate perpendicular to the first plate respectively.

8. The secondary battery of claim 4, wherein the first plate is resistance-welded or laser-welded to the top surface of the bare cell.

9. The secondary battery of claim 4, wherein the second plate and the third plate are resistance-welded or laser-welded to the first sub-terminal and the second sub-terminal respectively.

10. The secondary battery of claim 4, wherein an extension plate is formed on one side of the first plate facing a second short edge of the bare cell.

11. The secondary battery of claim 4, wherein edges of the fourth plate and the fifth plate facing the first short edge of the bare cell are inclined such that the widths of the fourth plate and the fifth plate become longer as the fourth and the fifth plate go downward.

12. The secondary battery of claim 4, wherein the fourth plate and the fifth plate are bent.

13. The secondary battery of claim 4, wherein welding holes are formed in the second plate and the third plate and the second plate and the third plate are soldered to the first sub-terminal and the second sub-terminal respectively.

14. The secondary battery of claim 3, wherein the second lead plate includes:
   a first plate located on the top surface of the bare cell and electrically connected to the bare cell;
   a second plate located under the bottom surface of the first sub-terminal and electrically connected to the first sub-terminal;
   a third plate located under the bottom surface of the second sub-terminal and electrically connected to the second sub-terminal; and
   a fourth plate and a fifth plate located at positions of the first plate in correspondence to the first long edge and the second long edge of the bare cell, electrically connected to the second plate and the third plate, and maintaining an interval between the bare cell and the protection circuit module.

15. The secondary battery of claim 14, wherein an extension plate is formed on one side of the first plate facing a first short edge of the bare cell.

16. The secondary battery of claim 14, wherein edges of the fourth plate and the fifth plate facing the second short edge of the bare cell are inclined such that the widths of the fourth plate and the fifth plate become longer as the fourth and the fifth plate go downward.

17. The secondary battery of claim 14, wherein welding holes are formed in the second plate and the third plate and the second plate and the third plate are soldered to the first sub-terminal and the second sub-terminal respectively.

18. The secondary battery of claim 1, wherein a second hole formed by opening a portion of the second short edge is formed in the board.

19. The secondary battery of claim 1, wherein a second lead plate connecting the protection circuit module to the bare cell is located between a second short edge of the board and the bare cell.

20. The secondary battery of claim 19, wherein the second lead plate electrically connects the protection circuit module to the bare cell.

21. The secondary battery of claim 19, wherein the second short edge of the board defines a bottom surface and wherein a second terminal having a first sub-terminal having a bottom surface and a second sub-terminal having a bottom surface corresponding to each other is located on the bottom surface of the second short edge of the board so that the second hole is located between the first and second sub-terminal.

22. The secondary battery of claim 21, wherein the fourth plate and the fifth plate are bent.

* * * * *